United States Patent
Fateev et al.

(10) Patent No.: US 12,048,233 B2
(45) Date of Patent: Jul. 23, 2024

(54) METHOD FOR PRODUCING A SEMICONDUCTING FILM OF ORGANIC-INORGANIC METAL-HALIDE COMPOUND WITH PEROVSKITE-LIKE STRUCTURE

(71) Applicant: JOINT STOCK COMPANY KRASNOYARSK HYDROPOWER PLANT (JSC KRASNOYARSK HPP), Divnogorsk (RU)

(72) Inventors: Sergei Anatolyevich Fateev, Sankt-Peterburg (RU); Alexey Borisovich Tarasov, Moscow (RU); Nikolai Andreevich Belich, Borovsk (RU); Aleksey Iurievich Grishko, Volgograd (RU); Natalia Nikolaevna Shlenskaia, Avtopoligon (RU); Eugene Alekseevich Goodilin, Moscow (RU); Andrey Andreevich Petrov, Sankt-Peterburg (RU)

(73) Assignee: JOINT STOCK COMPANY KRASNOYARSK HYDROPOWER PLANT (JSC KRASNOYARSK HPP), Divnogorsk (RU)

( * ) Notice: Subject to any disclaimer, the term of this patent is extended or adjusted under 35 U.S.C. 154(b) by 398 days.

(21) Appl. No.: 17/619,077

(22) PCT Filed: Jun. 16, 2020

(86) PCT No.: PCT/RU2020/050124
§ 371 (c)(1),
(2) Date: Dec. 14, 2021

(87) PCT Pub. No.: WO2020/256594
PCT Pub. Date: Dec. 24, 2020

(65) Prior Publication Data
US 2022/0263025 A1    Aug. 18, 2022

(30) Foreign Application Priority Data

Jun. 19, 2019  (RU) ............................... 2019119025

(51) Int. Cl.
*H10K 30/10*    (2023.01)
*C23C 26/02*    (2006.01)
(Continued)

(52) U.S. Cl.
CPC ............ *H10K 71/12* (2023.02); *C23C 26/02* (2013.01); *H10K 30/50* (2023.02); *H10K 85/50* (2023.02); *H10K 30/451* (2023.02)

(58) Field of Classification Search
CPC ...... H10K 71/12; H10K 30/451; H10K 30/50; H10K 85/50; Y02E 10/549
See application file for complete search history.

(56) References Cited

U.S. PATENT DOCUMENTS

| 2017/0321117 A1* | 11/2017 | Weidman | ............... C09K 11/06 |
| 2022/0115593 A1* | 4/2022 | Singh | .................. H10K 71/135 |
| 2023/0284467 A1* | 9/2023 | Chen | .................. H01L 31/1075 136/243 |

FOREIGN PATENT DOCUMENTS

| RU | 2685296 C1 | 4/2019 |
| WO | 2018124938 A1 | 7/2018 |
| WO | 2019031991 A1 | 2/2019 |

* cited by examiner

*Primary Examiner* — David Vu
*Assistant Examiner* — Brandon C Fox
(74) *Attorney, Agent, or Firm* — Nadya Reingand (57) ABSTRACT

This invention relates to a method for producing films of semiconducting material based on the organic-inorganic metal-halide compounds with perovskite-like structure, which can be used as a light-absorbing layer in solar cells, including thin-film, flexible and tandem solar cells, as well as can be applied for optoelectronic devices, in particular, (Continued)

light emitting diodes. The method is comprising the following steps: (a) applying a layer of a precursor, (b) applying a layer of composite reagent, and (c) treatment of the applied layers by the reagent X2 wherein the composite reagent applied in the step b) contains a mixture of AX and X2 reagents, and the film obtained after the step b) contains the seeds of the phase with a perovskite-like structure; the reagent AX is a salt comprising cation A+ and anion X−, and the anion X− is a singly charged anion; the reagent X2 is a molecular halogen.

6 Claims, 2 Drawing Sheets

(51) Int. Cl.
*H10K 30/50* (2023.01)
*H10K 71/12* (2023.01)
*H10K 85/50* (2023.01)
*H10K 30/00* (2023.01)

METHOD FOR PRODUCING A SEMICONDUCTING FILM OF ORGANIC-INORGANIC METAL-HALIDE COMPOUND WITH PEROVSKITE-LIKE STRUCTURE

FIELD OF THE INVENTION

This invention relates to the field of materials science, in particular, to a method for producing films of semiconducting material based on the organic-inorganic metal-halide compounds with perovskite-like structure, which can be used as a light-absorbing layer in solar cells, including thin-film, flexible and tandem solar cells, as well as can be applied for optoelectronic devices, in particular, light emitting diodes.

BACKGROUND OF THE INVENTION

Several methods for the preparation of semiconductor films of light-absorbing materials with a perovskite-like structure are known so far.

The preparation of a thin layer or film of perovskite $CH_3NH_3PbI_3$ in one step by applying a solution of perovskite in organic mixed solvent on a substrate with a thin layer by bringing it into rotation at high speed around an axis perpendicular to layers plane is described in the ref. [Saliba M. et al. Incorporation of rubidium cations into perovskite solar cells improves photovoltaic performance//Science (80-.). 2016. Vol. 354, No 6309. P. 206-209.]. In this case, the resulting perovskite film, integrated together with other layers in the composition of the solar cell, serves as a light-absorbing material. In particular, this article describes the creation of a perovskite solar cell consisting of five main functional layers applied onto a glass substrate: a transparent electrically conductive electrode (e.g. FTO), a electron transport layer (e.g. $TiO_2$ blocking layer), a light-absorbing layer (perovskite), and a hole transport layer (e.g. Spiro MeOTAD), reverse electrode (Au). Light is absorbed by perovskite layer, which leads to the formation of nonequilibrium charge carriers in it—electrons and holes. Further, the electrons and holes migrate to the electron-transport and hole-transport layers, respectively, and further to the corresponding electrodes.

The disadvantage of the above method is the difficulty of perovskite layer preparation from a solution on large area substrates and, accordingly, the inability of large-area perovskite solar cells fabrication.

The known documents of particular relevance to the claimed invention are:
- publication WO2018124938A1 "Methods for producing light-absorbing materials with perovskite structure and liquid polyhalides of variable composition for their implementation",
- patent RU2685296 "method for producing a film of light-absorbing material with a perovskite-like structure",
- and patent RU2675610 "a method for producing a film of a light-absorbing material with a perovskite-like structure".

The method described in publication WO2018124938A1 consists in mixing the reagent of the composition $AX-nX_2$, where n is greater than or equal to one, while component A is a singly charged organic or inorganic cation or a mixture thereof, component $X_2$ is $Cl_2$, $Br_2$, $I_2$ or mixture thereof, and a reagent containing B, which is used as a film of Sn, Pb or Bi of a given thickness in the form of a metal or in alloys, oxides, salts. The reagent composition $AX-nX_2$ is applied to the reagent B. The reaction proceeds: $B+AX+X_2=ABX_3$, resulting in perovskite $ABX_3$, excess reagents are removed if necessary.

A disadvantage of the known method is the impossibility of dosing a polyiodide (polyhalide) reagent in amount which is stoichiometric with respect to component B per unit area of the film. The impossibility of dosing is a consequence of the high reactivity and viscosity of the liquid composition $AX-nX_2$. The $AX_3/B$ ratio significantly (more than 5%) different from the stoichiometric one corresponding to pure $ABX_3$ inevitably leads to a deterioration in the quality (in particular, uniformity of thickness and phase purity) of the resulting film of a semiconductor material, which negatively affects the efficiency of solar cells based on obtained films.

The method described in patent RU 2685296 C1, consists in that a uniform layer of component B is formed on the substrate, a mixture of reagents that react with component B is prepared under predetermined conditions, and of a reaction inhibitor that suppresses this reaction under these conditions, the prepared mixture is applied in an amount stoichiometric or greater than stoichiometric to the layer of component B and the reaction inhibitor is removed from the mixture, so that a chemical reaction between the mixture of reagents and component B is activated to form a film of perovskite-like material ($ABX_3$).

The above method allows the formation of a perovskite layer on surfaces of virtually any size. However, the disadvantage is low efficiency (not higher than 5%) of the films obtained using this method. [Stepanov N M, Petrov A A, Belich N A, Tarasov A B, Study of the reactivity of the ternary system MAI—$I_2$-i-PrOH with metallic lead to obtain $MAPbI_3$ films (MA=$CH_3NH_3$), abstracts at the conference XXV International Conference of Students, Graduate Students and Young Scientists "Lomonosov", Russia, Apr. 9-13, 2018], [Rakita Y. et al. Metal to Halide Perovskite (HaP): An Alternative Route to HaP Coating, Directly from Pb (0) or Sn (0) Films//Chem. Mater. 2017. Vol. 29, № 20. P. 8620-8629]. This problem is a consequence of the fundamental flaws inherent in this method, in particular:

1) The precise control over the conditions and the rate of the process of the formation of the perovskite layer can hardly be achieved within the abovementioned method. Accordingly, the morphology and size of grains and crystallites of the resulting perovskite film. This problem is caused by the high reactivity of the $AX-nX_2$ composition of polyiodide melts formed upon removal of the inhibitor, as well as their increased recrystallization ability with respect to the perovskite layer.
2) Phase segregation during the formation of mixed-cation perovskites containing cesium and formamidinium ($FA^+$) cations because the process of chemical conversion at low temperatures leads to the irreversible formation of non-perovskite low-temperature phases, for example, $\delta$-$CsPbI_3$, $\delta$-$FAPbI_3$.

The method for producing a film of a light-absorbing material with a perovskite-like structure having the structural formula $ADE_3$ (in the terminology of the claimed invention, component D is identical to component B, component E is identical to component X) disclosed in patent RU 2675610 is the most relevant to the claimed invention in terms of technical essence. This method is realizing by following: a layer of reagent D and a layer of reagent AE are successively applied to the substrate, after which the substrate with the deposited layers is placed in a liquid or gaseous medium containing reagent B2 for the period necessary and sufficient for the reaction to proceed: C+AE+

$E_2 = ADE_3 + X$, with $CH_3NH_3^+$ or $(NH_2)_2CH^+$ or $C(NH_2)_3^+$ or $Cs^+$ or a mixture thereof as component A, Cl or Br is used as component E or I or a mixture thereof, Sn, Pb or Bi metals or their alloys or oxides or salts act as component D, and X represents the decomposition product of component D when an oxide or salt is used as it.

The main disadvantage of the above method is the difficulty of controlling the deposition of a layer of reagent AE on the substrate surface with a layer of component D. In particular, in the case of organic cation A the deposition of the AE reagent thin layer by gas-phase or thermal-evaporative methods is difficult due to the possibility of their thermal decomposition and uncontrolled deposition in the regions of the substrate, on which its deposition is undesirable or unacceptable.

The use of vacuum deposition for the application of reagent AE, allows to achieve the dosage of reagent AE per unit area, however, requires the use of expensive equipment.

In addition, the bilayer structure AE@D formed by any of the possible methods exhibits an extremely high sensitivity to air moisture due to the high moisture sensitivity (hygroscopicity) of AE reagent. The latter requires the use of special conditions, technical means and solutions when handling the resulting bilayer structure.

These two factors significantly reduce the technological advantages of this method for large-scale producing of perovskite thin films and devices based on them.

THE TERMINOLOGY OF THE INVENTION

In the context of this invention, the perovskite-like structure means both the perovskite structure and any structures derived from perovskite structure. Accordingly, the terms "perovskite-like compounds" and "perovskite-like phases", as used herein, refer to compounds and phases with a perovskite-like structure respectively.

In particular, the term "halide perovskite" in the context of this invention means phases with the formula of $ABX_3$ with cubic crystal system or any lower crystal system (foe.g. tetragonal, orthorhombic), as well as mixtures of different phases of halide perovskites. The structure of halide perovskites consists of a three-dimensional network of corner connected regular or distorted octahedra $[BX_6]$ consisting of a central atom—component B (cation $B^{n+}$) and six X atoms (anions $X^-$).

In particular, "the perovskite-like structure", as used herein, refer to the set of structures of so-called layered or two-dimensional or low-dimensional perovskite-related compounds containing layers of corner connected octahedra $[BX_6]$ (perovskite layers), alternating with layers of another motif (for example, the Aurivillius phases, Ruddlesden-Popper phases, Dion-Jacobson phases) [Mitzi D. B. Synthesis, Structure, and Properties of Organic-Inorganic Perovskites and Related Materials//Progress in Inorganic Chemistry, Volume 48. Wiley Online Library, 2007. P. 1-121]. The perovskite-like compounds and perovskite-like phases are relate to compounds and phases with a perovskite-like structure respectively.

The halide perovskite and the halide perovskite-like phases described above belong to complex halide salts comprising haloplumpates, halostannates and halobismuthates (complex metal-halide salts of lead, tin and bismuth respectively), therefore, in general, such materials are referred to as organic-inorganic metal-halide compounds with perovskite-like structure.

The term "seeds", as used herein, refers to small grains or nuclei of crystallites of the perovskite-like phase with a size in any direction of no more than 100 nm.

DISCLOSURE OF THE INVENTION

A technical problem is the need to overcome the disadvantages inherent in the known analogues and prototype by inventing a simpler and more technologically advanced method for producing semiconducting films of organic-inorganic metal-halide compounds with perovskite-like structure which can be used as a light-absorbing layer in the perovskite solar cells to increase their power conversion efficiency (PCE or efficiency) in comparison with analogues.

The technical result achieved by using the claimed invention is to enable the formation of a film of a perovskite-like phase with increased average grain size in comparison with related methods due to the introducing of an intermediate step providing the formation of a film comprising the seeds of the phase with a perovskite-like structure, as well as the initial reagent AX and precursor of component B (hereinafter "precursor B"), which ensures the increase in the efficiency (PCE) of the solar cells based on the obtained film of the perovskite-like material as a light-absorbing layer.

An additional technical result is improving of the electronic and optical properties of perovskite films obtained using the proposed method in comparison with related methods involving the reaction conversion of the component precursor B by the action of reagents AX and $X_2$ into a organic-inorganic metal-halide compound with perovskite-like structure.

Another advantage of the proposed method is the possibility of its implementation without the use of specialized expensive equipment and complicated technical requirements, which makes the claimed method more relevant for use in industrial large-scale production.

The formation at the intermediate step of the said film, comprising the seeds of the phase with a perovskite-like structure, as well as the initial reagent AX and precursor B, is necessary for increasing of the grain size in the resulting film of organic-inorganic metal-halide compound with perovskite or perovskite-like structure. An increase in the grain size improves the electronic and optoelectronic properties of the film of a polycrystalline semiconductor material, in particular, leads to a decrease in the recombination of charge carriers at grain boundaries, which leads to an increase in the efficiency (PCE) of devices based on the films of the same material with larger grains (see Table-1 in the section Examples of the invention). When the said film, comprising the seeds of the phase with a perovskite-like structure, as well as the initial reagent AX and precursor B, is treated by halogen the seeds grow consuming the initial reagent AX and precursor B and other seeds through a chemical reaction between the reagent AX, precursor B and $X_2$ (e.g. $B + AX + X_2 = ABX_3$) finally leading to the film of the perovskite-like phase with large grains (average size 500 nm or more). Treatment by halogen is carried out at a given temperature and a given partial pressure of halogen (or a given concentration), which provides the control of the chemical reaction rate and the grain size of the perovskite film, ensuring overcoming of the analogs and prototype disadvantages.

In the context of this invention, the chemical conversion means a chemical processes leading to the formation of halide perovskite $ABX_3$ or a halide perovskite-like compound of the composition $A_{n+1}B_nX_{3n+1}$ where $1 < n < 100$, as a result of the reaction between the precursor of component B (metal, alloy, oxide), reagent AX and reagent $X_2$. In the general case, the reaction can be written by the following equation:

$$nB'+(n+1)AX+((3n+1)/2)X_2=A_{n+1}B_nX_{3n+1}+Y, \quad (5)$$

where B'—is the precursor of component B, and Y—is a by-product releasing in the cases of using an oxide or salt as a precursor of the component B.

The chemical conversion can occur as a result of both simultaneous addition of components, and multiple sequential additions. In the context of this invention, the full chemical conversion of initial reagents (AX, $X_2$) and precursors (B) into the organic-inorganic metal-halide compound with perovskite-like structure means that more than 90% (mole fraction) of the initial substances (reagents and precursors) have reacted.

THE DETAILED DESCRIPTION OF THE INVENTION

The described in this invention method of producing semiconducting film of the organic-inorganic metal-halide compounds with perovskite or perovskite-like structure is a process comprising the following main:

Step-I: the formation of the precursor layer of component B, where B'=Pb, Sn, Bi on the surface of substrate.

Step-II: applying to the surface of the precursor layer of component B of the composite reagent containing a mixture of components $A^+$ and $X^-$ with a molar ratio of $0.5<[A^+]/[X_-]<10$ or reagent AX and reagent X2 with a molar ratio in the range $0<[X^-]/[X_2]<1$ or $0<[X_2]/[AX]<1$, respectively, with the formation of a film containing seeds of the perovskite-like phase, as well as components of the AX and B. This step can include an additional step of post-processing (heating, annealing, light irradiation) of the obtained film without changing its chemical composition.

Step-III: treatment (exposure) of the previously formed film containing the seeds of the perovskite or perovskite-like phase, as well as reagent AX and the precursor of component B, by reagent $X_2$, resulting in the formation of the semiconducting film of the organic-inorganic metal-halide compound with perovskite or perovskite-like structure or a film of material with composition identical to the target phase of the organic-inorganic metal-halide compound with perovskite or perovskite-like structure, or mixtures thereof. In the last two cases, an auxiliary step of post-processing of the film of the obtained material is introduced to ensure the complete conversion of any impurity phases of the film material into the target phase of the organic-inorganic metal-halide compound with perovskite or perovskite-like structure.

In the first step (step I), a precursor layer of component B is formed on the surface of the carrier substrate. In this case, glass, a transparent conductive silicon oxide, a polymer, including a transparent and conductive polymer, are used as the carrier substrate, and any other material inert with respect to the reagents used and the final material (perovskite halide or perovskite-like compound). It was experimentally shown that the physicochemical processes that occur at all three main steps of the proposed process do not depend on the nature of the inert material of the carrier substrate. Inert material in the terminology of the claimed invention is any material that does not enter into any chemical interactions with the final material, its components, reagents and solvents used in its synthesis. Hereinafter, we will call the substrate material the material of the upper layer of the substrate, directly onto which the precursor of component B is applied.

In one embodiment of this invention, the carrier substrate material was chosen identical to the materials used in the construction of perovskite solar cells and similar photovoltaic devices. Typically, in such devices, an $ABX_3$ layer is applied to the surface of a layer of a transparent electronically conductive material (transparent electrically conductive oxide, electrically conductive polymer) deposited on top of glass or a transparent polymer. In the general case, it is assumed that the carrier substrate contains all the functional layers necessary to create the finished device (solar cell, LED), except for the layer of light-absorbing material $ABX_3$ and overlying functional layers.

In one embodiment of this invention, layers of lead, tin or bismuth with a thickness of 5 nm to 500 nm were sprayed onto substrates of the following materials: fluorine-doped tin oxide (FTO) glass, doped with indium tin oxide (ITO), tin oxide $SnO_2$ (on FTO, ITO) or titanium oxide $TiO_2$ (planar and mesoporous layer), polyethyleneterephthalate, polytriarylamine (PTAA).

Before applying the precursor layer of component B, the surface of the carrier substrate is thoroughly cleaned of contaminants. In particular, they are purified in an aqueous solution of surface-active substances (surfactants) using ultrasound, washed with distilled water and purified with ozone plasma.

The precursor of component B is applied in the form of a metal film—Pb, Sn, Bi or their alloy or a layered structure containing several layers of metals (Pb, Sn, Bi) located one on top of the other. Also, salts and oxides of lead, for example, $PbI_2$ and PbO, can also be used as a precursor to component B.

The precursor of component B is applied by vacuum deposition, electrochemical deposition, chemical vapor deposition, decomposition of a previously applied solid phase compound containing component B, or by other methods.

The most convenient and technologically advanced is the use of metal component B as a precursor. Methods for applying metal films of a given thickness are well known, widely distributed and available.

In one embodiment, the films of the precursor of component B in the form of a metal (tin, lead, bismuth) were deposited by thermal or magnetron sputtering in vacuum. At the same time, a cleaned substrate was placed in a vacuum chamber, fixed at a predetermined distance from the heating crucible or magnetron target, and sputtering was carried out with the thickness of the sprayed coating controlled by a quartz thickness sensor.

In the second step (step II), the composite reagent is applied to the surface of the precursor layer of component B, the composite reagent containing a mixture of components $A^+$ and $X^-$ with a molar ratio of $0.5<[A^+]/[X^-]<10$ or reagent AX and reagent $X_2$ with a molar ratio in the range $0<[X^-]/[X^-_2]<1$ or $0<[X_2]/[AX]<1$, respectively, with the formation of a film containing seeds of perovskite-like phase, as well as reagent AX and precursor B.

The composite reagent containing reagent AX or a mixture of components $A^+$ and $X^-$, as well as reagent $X_2$, is distributed in a uniform thin layer on the surface of the precursor layer of component B using inkjet printing, screen printing, spin-coating, and immersion coating aerosol spraying method, in particular, ultrasonic spraying, atomization through a nozzle, electro-spraying, aerosol inkjet printing or other methods.

As the composite reagent, a solution or a solvent diluted melt containing cation $A^+$, anion $X^-$ and halogen $X_2$, as well as a colloid or suspension or emulsion containing these components in a liquid or solid phase in a mixture with one or more solvents are used.

To add components $A^+$ and $X^-$ to the composition of the composite reagent in the necessary stoichiometric ratio, it is possible to use both the AX salt itself and any mixture of salts, at least one of which contains component $A^+$, and any other component $X^-$. As a result of mixing, both components $A^+$ and $X^-$ appear in the composition of the solution. In one embodiment of this invention, the composite reagent was prepared using acetates, formates, fluorides, oxalates of singly charged organic cations mixed with ammonium, potassium halides or with hydrogen halides as an anion halide source, while the organic cation salt and anion halide source were taken in a ratio close to unit.

In one embodiment of this invention, methylammonium iodide ($CH_3NH_3I$), methylammonium bromide ($CH_3NH_3Br$), formamidinium iodide (FAI), formamidinium bromide (FABr), cesium iodide (CsI) and various halide salts of substituted (primary, secondary, tertiary, or quaternary) ammonium cations and other stoichiometric halides with suitable singly charged cations were used as the AX salt.

For the successful implementation of the proposed method, the concentration of reagents AX and $X_2$ in the applied composite reagent is selected in such a way as to ensure the application of component A in an amount stoichiometric with respect to component B per unit area of the film.

This condition is fulfilled, in particular, when a precursor component A of reagent AX is applied to the film surface in a stoichiometric amount per unit area of the film. In this case, a deviation of up to 10% from the optimal A/B ratio for the resulting material may be acceptable.

For 3D halide perovskites, the optimal ratio is A/B=1, since it corresponds to the stoichiometry of the final material $ABX_3$ and results in a single-phase film after the conversion is completed. For another perovskite-like compounds, this ratio may vary depending on the desired compound. In particular, it was shown that the ratio A/B=(n+1)/n is optimal for layered halide perovskites.

In one embodiment, the layered halide perovskites $BA_2PbI_4$, $PEA_2PbI_4$, $BDAPbI_4$, ($BA^+$ is the butylammonium cation, $PEA^+$ is the phenylethylammonium cation, $BDA^{2+}$ is the butanediammonium cation) were obtained with optimal A/B ratio about 2. Analogously, the optimal A/B ratios for any given perovskite-like compound can be easily calculated according to its chemical formula.

The most convenient and technically simple way to apply a given amount of reagents AX and $X_2$ per unit area of the film of precursor B is to distribute their solution over the surface of the precursor layer of component B. In this case, acetone, alcohols, tetrahydrofuran, dioxane, acetonitrile or a mixture of these solvents are used as any ratio, it is also possible to use any other organic or inorganic neutral solvent. In this context, a neutral solvent is any solvent that is not able to dissolve the compounds of component B at a concentration of more than 0.3 M.

In different embodiments of the invention, the composite reagent comprising reagents AX and $X_2$ may be applied on the substrate by any means. Typically, to provide a uniform distribution of a thin layer of the reagents AX and $X_2$ over the surface of a substrate, the spin-coating method is convenient, as it is fast and requires a small amount of solution. Generally, in the case of the substrates of large area the composite reagent is applied on the substrate by spin-coating, spray-coating (aerosol spraying), slot-die coating or vapour deposition.

To successfully realize the claimed method, it is necessary to obtain after step-II a film not only having A/B ratio corresponding to chemical formula of desired perovskite-like compound, but also containing seeds of perovskite-like phase (perovskite phase nuclei), as well as residual reagent AX and precursor B.

A fundamentally important condition for the formation of perovskite phase nuclei is the possibility of a chemical reaction of the reagent solution AX and $X_2$ with the precursor of component B to form perovskite. In this case, only part of the initial precursor of component B should be subjected to chemical conversion into perovskite, and part of it should remain unchanged in order to react with an excess of the applied reagent AX during treatment by halogen in the next step (III) with the formation of perovskite.

The amount of perovskite-like phase in the form of seeds after the step-II is determined by the amount of halogen $X_2$ in the applied composite reagent. For this, the process is carried out under such conditions in which only a chemical reaction (chemical conversion) of the component B precursor into perovskite occurs while it interacts with reagents AX and $X_2$, and perovskite does not form when the component B precursor interacts with AX. These conditions are realized, since reagents AX and $X_2$ together form a highly reactive polyiodide melt [Petrov A. A. et al. A new formation strategy of hybrid perovskites via room temperature reactive polyiodide melts//Mater. Horiz. 2017. Vol. № 4.P. 625-632.], which reacts with the precursors of component B with the formation of perovskite in seconds or tens of seconds even at low temperatures, while the reaction of component B with reagent AX can proceed at a noticeable rate only at elevated temperatures or during the order of hours.

Therefore, in the case of applying a stoichiometric amount of AX to the precursor of component B, the amount of perovskite will be determined by the ratio $[X_2]/[AX]$ or the proportion of halogen—δ.

Thus, the general equation for the chemical processes occurring in step II can be written as follows:

$$B' + AX + \delta X_2 \rightarrow ABX_3 + (1-\delta)B''@AX + T\uparrow$$

where B' is the initial precursor of component B (usually in the form of a metal), B" is the final precursor of component B (neither perovskite nor perovskite-like compound), usually identical to the original precursor B', Y is a by-product (then can be removed by post-processing).

In one embodiment of the invention, a solution of reagents AX and $X_2$ in an organic solvent is applied to the surface of the component B precursor by spin-coating (or spin-coating) spinning coatings in an organic solvent to form a film containing nuclei of grains of the halide perovskite phase. In the process of spin-coating (disclosed, for example, in dissertations (http://konfx-pdf.ru/18fizika/632895-1-fotovoltaicheskie-strukturi-osnove-organicheskih-polupro-vodnikov-kvantovih-tochek-cdse.php);

GOST R ISO 27911-2015 "State system for ensuring the uniformity of measurements (GSI). Chemical analysis of the surface. Scanning probe microscopy. Determination and calibration of the lateral resolution of a near-field optical microscope" (http://docs.cntd.ru/document/1200119068);

in https://www.msu.ru/science/main_themes/v-mgu-razrabotali-novuyu-strategiyu-polucheniya-perov-skitnykh-solnechnykh-yacheek.html) the solution is distributed on the surface with an even thin layer, at the same time the evaporation of the solvent begins, as a result, the concentration of reagents AX and $X_2$ in a thin layer above the film of the precursor of component B increases and a quick chemical reaction of AX and $X_2$ with the precursor of component B begins. If the ratio $[X_2]/[AX]$ is greater than 0 and less than 1, the result is a film containing nuclei of grains of the perovskite phase or perovskite-like phase, as well as AX and B. The formation of such a film is achieved in a time of the order of 5-100 seconds when the process is carried out at temperatures of 10-40° C. In the absence of $X_2$, the formation of perovskite under these conditions does not occur, whereas when the ratio $[X_2]/[AX]$ is greater than 1, the reaction completely converts component B into the halide perovskite by the precursor.

Thus, the key step of the proposed method (the formation of a film containing perovskite or perovskite-like phase nuclei, as well as reagent AX and precursor B) can be realized if the ratio $[X_2]/[AX]$ lies in the range greater than 0 and less than 1, with this optimal ratio is close to 0.5 (see section Examples of the invention and Table-1).

In special cases of the invention, the film obtained in step II can be subjected to additional post-processing. Post-treatment may consist of annealing (heat treatment), treatment in an atmosphere of a given composition (inert gas, dry air, moist air, solvent fumes), irradiation with visible, ultraviolet or infrared light. Post-processing is performed to remove residual solvent or other auxiliary reagent, remove possible by-products of the reaction of formation of a halide perovskite (or perovskite-like compound), and complete the desired reaction to the desired degree of progression. In most cases, the implementation of the invention, the post-treatment in step II consists in short-term (1-3600 seconds) annealing at a given temperature (30-300° C.).

In the third step (step III), the formed film containing embryos of grains of the perovskite phase or perovskite-like phase, as well as reagents AX and B, process X2 until the component B precursor and reagent AX are completely reacted to produce a film of a halide material with a perovskite structure or perovskite-like structure.

In one embodiment, the treatment by $X_2$ (halogen) or "halogenation" is carried out in a gas or liquid phase. In the first case, halogen vapors are used; in the second case, a solution of halogen in a neutral solvent. In this context, a neutral solvent is understood to mean any solvent that does not dissolve the final material (e.g. perovskite $ABX_3$) and not interact chemically not interact with it, and also does not dissolve reagent AX and precursor B and not interact chemically with them.

In one embodiment, alkanes (heptane, octane, decane), haloalkanes (chloroform, dichloromethane), toluene, chlorobenzene, ethers and esters and other slightly polar or non-polar solvents and any mixtures thereof are used as a solvent for halogen X2. It was experimentally shown that the nature of the neutral solvent does not affect the chemical conversion of reagent AX and the precursor of component B when halogen is exposed to a halide perovskite or perovskite-like phase, therefore, any neutral solvent can be used in principle.

In one embodiment, halogenation from the gas phase is carried out at room temperature in an atmosphere of air or neutral gas within a closed thermostatic vessel, into which the film formed in step II is placed.

During the treatment of the film formed at the step-II by halogen ($X_2$) the reagent AX and precursor B contained in film react with halogen previously near the seeds of perovskite-like phase, resulting in the growth of the latter with formation of large grains of perovskite-like phase (typically>500 nm). Generally, the "large grains" of the polycrystalline thin film defines herein as grains whose average size is greater than or equal to the film thickness. The optimal thicknesses of the film of perovskite-like phase is in the range of 200-1000 nm, which typically ensure absorption of more than 90% of the incident light by the film.

The optimal conditions for the chemical conversion to obtain films of halide perovskites of a given composition and a given thickness were selected by varying the temperature and time of processing (time of chemical conversion), as well as the pressure of the halogen vapor or the concentration of halogen in the solution. In different embodiments of the invention, the said parameters were varied as following: the temperature from 0 to 300° C., time of processing from 5 s to 3600 s, the partial pressure of halogen vapors from 0.01 mmHg up to 500 mmHg (see Table 1).

Processing with halogen at a given temperature and a given partial pressure of halogen (or a given concentration in the case of a solution) allows you to set the rate of halogen influx to the film surface, thus setting the conversion reaction rate and the grain size of the formed perovskite film. An increase in temperature and/or partial pressure leads to an acceleration of the conversion reaction. The crystallite size increases with increasing duration of the conversion reaction. However, starting from some processing time, when the complete conversion of the film has already been achieved, further processing can lead to a deterioration in the morphology and optoelectronic properties of the perovskite halide film.

It should be noted that during the treatment by halogen $X_2$, the formation of the reactive polyhalide melts occurs according to the reaction $AX+nX_2 \rightarrow AX_{2n+1}$ [Petrov A. A. et al. A new formation strategy of hybrid perovskites via room temperature reactive polyiodide melts//Mater. Horiz. 2017. Vol. 4, № 4. P. 625-632.]. The polyhalide melts facile the chemical conversion of the precursor of component B into the halide perovskite or perovskite-like phase. The key feature of the proposed method is the ability to control the rate of halogen influx to the film containing the necessary reagents and components for the reaction formation in the presence of halogen perovskite or perovskite-like compounds. The perovskite formed in this case by the reaction $B+AX+X_2=ABX_3$ does not form numerous small crystallites or grains, but ensures the growth or reaction growth of small perovskite phases present in the halogen-treated film. Thus, the total process that is being implemented at in the second and third steps of the proposed method can be reflected in the case of halide perovskite by the following equations:

(step-II)

(step-III)

where the reagents indicated in braces { } are part of the film formed in the second step.

Thus, in contrast to the method described in patent RU 2685296 C1, the claimed solution provides the delayed formation of perovskite halide during the chemical conversion with halogen, which contributes to the possibility of crystallite growth to a larger size, and the necessary condition for this is the formation of a film of the above composition on the second (intermediate) step of perovskite film formation. The slower formation of perovskite and, accordingly, the slower growth of crystals under conditions close to equilibrium, provide not only the possibility of producing films with larger crystallites, but also a lower concentration of defects in the crystals.

In one embodiment of this invention, the film of the halide perovskite or perovskite-like phase after completion of the chemical conversion under the influence of halogen is subjected to additional post-processing. Post-treatment may include annealing (temperature treatment), treatment in an atmosphere of a given composition (inert gas, dry air, moist air, solvent vapor), irradiation with visible, ultraviolet or infrared light, as well as treatment by a solution or solvent of the desired composition. Post-processing is performed to remove excess halogen adsorbed by the film, to remove possible by-products of the chemical conversion, or to improve the functional properties of the perovskite layer.

In one embodiment, during the reaction treatment by halogen for a long time (5 or more minutes), post-treatment was used to remove excess halogen $X_2$, which consisted in annealing the film at a given temperature or in a certain temperature range or in lowering the pressure above the film below atmospheric or using the indicated effects simultaneously. Moreover, the higher the temperature and the lower the pressure, the higher the rate of halogen removal. The optimum post-processing temperature of this material is one that ensures the rapid removal of excess halogen (in less than 10 minutes) and does not lead to decomposition of the material or the degradation of its properties even partially. For example, for the $FAPbI_3$ halide perovskite, the upper temperature limit is 190° C., for the $MAPbI_3$ perovskite-150° C., for the $CsPbBr_3$ perovskite-450° C.

The most technologically advanced and efficient post-processing method is annealing at elevated temperature for a period of time from several minutes to an hour. Annealing is carried out in a temperature range optimal for a given material (perovskite $ABX_3$ or perovskite-like phase) D and not exceeding the thermal stability range of this material.

Annealing was also carried out during the formation during the chemical conversion of phases coinciding in stoichiometry with perovskite halide, but having a different structure. For example, films of the $FAPbT_3$ composition, including, after carrying out the chemical conversion, the hexagonal phase of $FAPbT_3$, were annealed for 30 minutes at 160° C.

In one embodiment of this invention, it is possible to obtain layered halide perovskites of the composition $E_2A_{(n-1)}B_nX_{3n+1}$ containing as a spacing or interlayer organic cation $E^+$ selected from various substituted ammonium cations including primary (monosubstituted, $R-NH_3^+$), secondary $(R_1(R_2)NH_2^+)$, tertiary $([R_1(R_2)(R_3)NH]^+)$, and quaternary $([R_1(R_2)(R_3)NR_4]^+)$ ammonium cations. In this case halide or other salt of the corresponding cation or their mixture is added to the composite reagent and then applied to the surface of the precursor layer of component B in the step-II of the process.

The ratio of components E and A in the composite reagent is chosen close to their ratio in the resulting layered perovskite. The concentration of components varies from 0.1 M to 7 M. The halogen treatment in the third step of the process when producing films of layered perovskites is carried out at a temperature from 25° C. to 150° C., the optimal processing temperature for layered perovskites containing this bulk cation is close to the minimum temperature providing melting of the polyhalide of the desired substituted ammonium cation.

In one embodiment of this invention, thin films of layered halide perovskites of the composition $BA_2PbI_4$, $PEA_2PbI_4$, $BDAPbI_4$, $(BMA)_2PbI_4$, $BA_2MAPb_2I_7$ were obtained through chemical conversion of the pre-deposited film of Pb with a thickness of about 60 nm by applying the liquid composite reagent of different composition. In particular, In the step-III the solutions of butylammonium iodide with concentration [BAI]=0.9-1.1 M and molar ratio of $[I_2]$/[BAI]=0.5 were used as the composite reagent in the case of $BA_2PbI_4$; solution of iodine and phenylethylammonium iodide (PEAT) with a concentration [PEAT]=1.1 M and a molar ratio of $[I_2]$/[PEAI]=0.5 was used as the composite reagent in the case of $PEA_2PbI_4$; a solution of iodine and butanediammonium iodide ($BDAI_2$) with a concentration of 1.2 M and a molar ratio of $[I_2]$/[BDAI]=0.5 was used as the composite reagent in the case of $BDAPbI_4$; solution of iodine and butylmethylammonium (or butyl(methyl)azanium) iodide (BMAI) with [BMAI]=1.1 M and a ratio of $[I_2]$/[BMAI]=0.5 was used as the composite reagent in the case of $(BMA)_2PbI_4$; solution of iodine and butylammonium and methylammonium (MAI) iodides with a BAI concentration of 0.6M and an MAI concentration of 0.3M and an overall ratio of iodine to iodide close to 0.5 was used as the composite reagent in the case of $BA_2MAPb2I_7$. In the step-III, the obtained as described above films were treated by halogen ($I_2$) vapors for 5 minutes at the temperature of 50° C. or above. These examples show that layered halide perovskites containing various substituted ammonium cations can be obtained under practically identical conditions. It should be noted that the conditions required for the preparation of layered perovskite are also independent of the type of substituents of the organic cation.

EXAMPLES OF THE INVENTION

The table below shows typical conditions for the formation of films and the efficiency of devices based on them (if they were made).

The first column «P[D]» indicates the precursor of component B. The optimal thickness of its layer is about 60-65 nm in the case of metal films—Pb, Sn, Bi or their alloys or layered structures containing several layers of metals (Pb, Sn, Bi) located one on top of the other.

The second column indicates the ratio $[X_2]/[AX]$ and the concentration of AX in the composite reagent applied. In all cases, except for applying pure AX, which was applied from the vapours, the composite reagent was used in the form of a solution of $X_2$ and AX in an organic solvent.

The third column shows the conditions of post-processing (e.g. annealing) of the film obtained by applying the reagent indicated in the column 2 onto the film of the precursor B.

The fourth column indicates the conditions of treatment of the precursor film formed after step-II by halogen ($X_2$).

The fifth column shows the conditions of final treatment (annealing) of the film obtained after completion of step-III (treatment by $X_2$), which is essential to remove an excess halogen and complete the formation of an $ABX_3$ layer.

The sixth column indicates the phase of the material obtained, according to x-ray phase analysis.

The seventh column indicates the average grain size of the obtained film of organic-inorganic metal-halide perovskite-like compound.

The eighth column indicates the PCE (%) of the fabricated solar cells comprising the obtained film of organic-inorganic metal-halide perovskite-like compound as a light-absorbing layer.

TABLE 1

| 1<br>P[D]<br>(I) | 2<br>$[X_2]/[AX]$,<br>C(M)<br>(II.1) | 3<br>Post-<br>processing<br>(II.2) | 4<br>$X_2$,<br>treatment<br>(III) | 5<br>Post-<br>treatment | 6<br>Phase<br>(compound) | 7<br>$d_{grains}$<br>(nm) | 8<br>PCE,<br>% |
|---|---|---|---|---|---|---|---|
| Pb | 0, * | $N_2$, 100° C., 3 min | $I_2$, 25° C., 6 min | $N_2$, 0 min | $MAPbI_3$ | 300 | 10 |
| Pb | 0.25, 0.6M | $N_2$, 100° C., 3 min | $I_2$, 25° C., 10 min | $N_2$, 100° C., 20 min | $MAPbI_3$ | 300 | — |
| Pb | 0.25, 0.7M | $N_2$, 100° C., 3 min | $I_2$, 25° C., 10 min | $N_2$, 100° C., 20 min | $MAPbI_3$ | 300 | 9 |
| Pb | 0.75, 0.5M | $N_2$, 100° C., 3 min | $I_2$, 25° C., 7 min | $N_2$, 100° C., 20 min | $MAPbI_3$ | 400 | 9 |
| Pb | 0.75, 0.6M | $N_2$, 100° C., 3 min | $I_2$, 25° C., 7 min | $N_2$, 100° C., 20 min | $MAPbI_3$ | 450 | 12.5 |
| Pb | 0.75, 0.7M | $N_2$, 100° C., 3 min | $I_2$, 25° C., 7 min | $N_2$, 100° C., 20 min | $MAPbI_3$ | 420 | 12 |
| Pb | 1.0, 0.5M | $N_2$, 100° C., 3 min | $I_2$, 25° C., 6 min | $N_2$, 100° C., 20 min | $MAPbI_3$ | 550 | 12 |
| Pb | 1.0, 0.6M | $N_2$, 100° C., 3 min | $I_2$, 25° C., 6 min | $N_2$, 100° C., 20 min | $MAPbI_3$ | 500 | 11.5 |
| Pb | 0.5, 0.5M | $N_2$, 100° C., 3 min | $I_2$, 25° C., 8 min | $N_2$, 100° C., 20 min | $MAPbI_3$ | 700 | 13.5 |
| Pb | 0.5, 0.6M | $N_2$, 100° C., 3 min | $I_2$, 25° C., 8 min | $N_2$, 100° C., 20 min | $MAPbI_3$ | 750 | 15.5 |
| Pb | 0.5, 0.6M | $N_2$, 80° C., 3 min | $I_2$, 25° C., 8 min | $N_2$, 100° C., 30 min | $MA_{0.25}FA_{0.75}PbI_3$ | 800 | 14.5 |
| Pb | 0.5, 0.7M | $N_2$, 80° C., 3 min | $I_2$, 25° C., 8 min | $N_2$, 100° C., 30 min | $MA_{0.25}FA_{0.75}PbI_3$ | >950 | 15.5 |
| Pb | 0.5, 0.65M | $N_2$, 100° C., 3 min | $I_2$, 25° C., 9 min | $N_2$, 120° C., 25 min | $MA_{0.25}FA_{0.75}PbBr_{0.5}I_{2.5}$ | >1000 | 15 |
| Pb | 0.5, 0.70M | $N_2$, 100° C., 3 min | $I_2$, 25° C., 9 min | $N_2$, 120° C., 25 min | $MA_{0.25}FA_{0.75}PbBr_{0.5}I_{2.5}$ | 900 | 19% |
| Pb | 0.5, 0.75M | $N_2$, 100° C., 3 min | $I_2$, 25° C., 8 min | $N_2$, 120° C., 25 min | $MA_{0.25}FA_{0.75}PbBr_{0.5}I_{2.5}$ | 950 | 18.5 |
| Pb | 0.5, 0.7M | $N_2$, 110° C., 3 min | $I_2$, 55° C., 5 min | $N_2$, 125° C., 40 min | $Cs_{0.05}MA_{0.2}FA_{0.75}PbBr_{0.5}I_{2.5}$ | 800 | 19.2 |
| $Pb_{0.8}Sn_{0.2}$ | 0.5, 0.6M | Ar, 60° C., 2 min | $I_2$, 40° C., 6 min | Ar, 100° C., 10 min | $MAPb_{0.8}Sn_{0.2}I_3$ | 850 | — |
| $Pb_{0.9}Bi_{0.1}$ | 0.5, 0.65M | $N_2$, 80° C., 4 min | $I_2$, 25° C., 8 min | $N_2$, 130° C., 20 min | $MA_{0.2}FA_{0.8}Pb_{0.9}Bi_{0.1}I_3$ | 500 | — |
| Pb | 0.5, 1.1M | $N_2$, 70° C., 4 min | $I_2$, 70° C., 8 min | $N_2$, 130° C., 20 min | $BA_2PbI_4$ | — | — |
| Pb | 0.5, 0.9M | $N_2$, 90° C., 4 min | $I_2$, 60° C., 8 min | $N_2$, 120° C., 30 min | $BA_2MAPb_2I_7$ | — | — |
| PbO | 0.5, 0.5M | $N_2$, 70° C., 2 min | $I_2$, 25° C., 6 min | $N_2$, 100° C., 20 min | $MAPbI_3$ | 550 | 12.5 |

Figure 1:
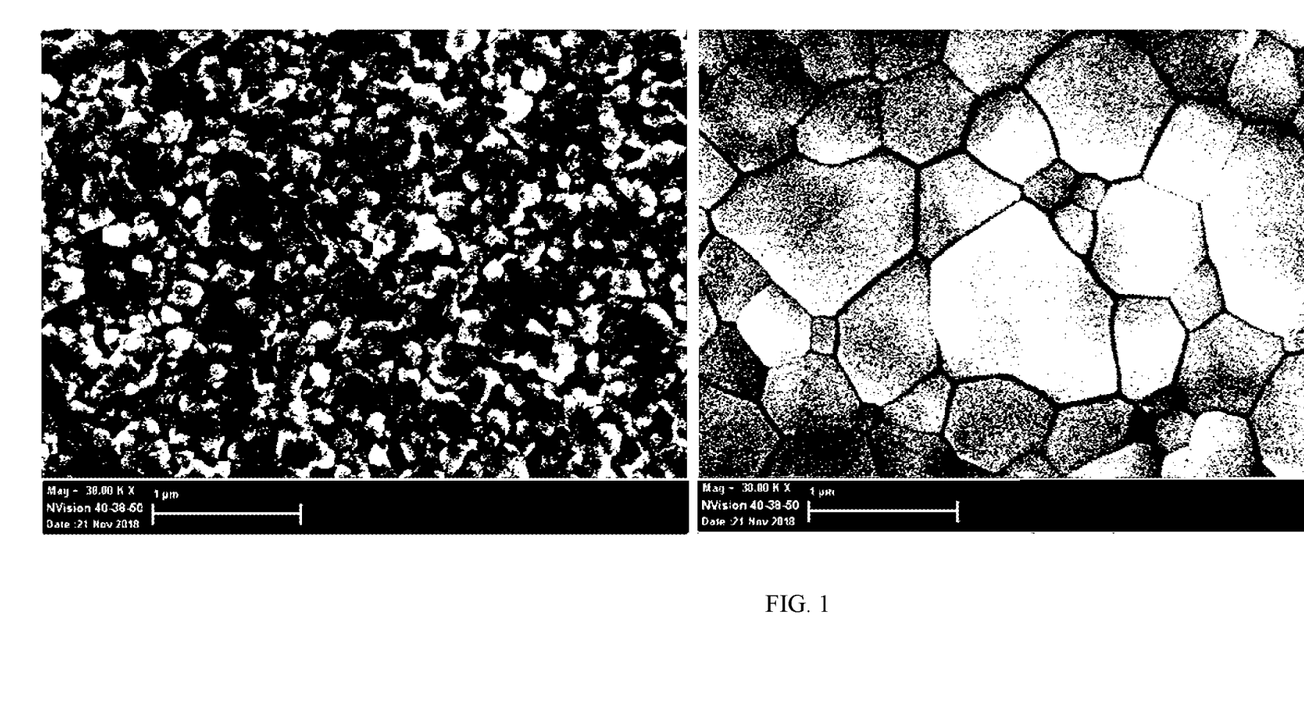
FIG. 1 shows micrographs of the top surface of the films using an scanning electron microscope (SEM). The FIG. 1 (a) (left) shows a micrograph of the surface of the film obtained after applying to the surface of metallic lead (a precursor of component B) a solution containing a mixture of reagents MAX and $X_2$ with a ratio of $[X_2]/[MAX]=0.5$. On the surface of the film, perovskite grains $MAPbI_3$ and MAI with a size of about 20-100 nm can be seen. The FIG. 1 (b) (right) is a micrograph of the surface of the final perovskite film obtained after treatment of the film shown in FIG. 1 (a) by iodine ($X_2$) vapours and after its full chemical conversion to perovskite $MAPbI_3$. The resulting film contains crystallites ranging in size from 200 nm to 1 μm or more.
Figure 2:
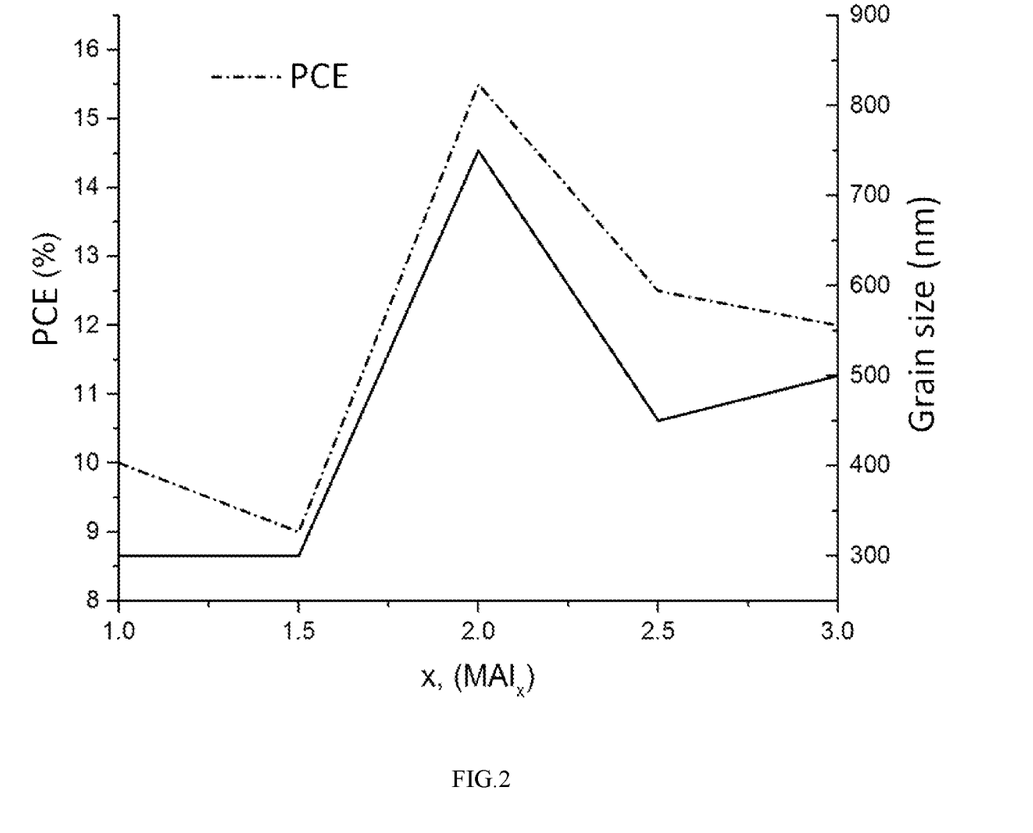
FIG. 2 shows a graph reflecting the dependences of the average grain size of the resulting $MAPbI_3$ perovskite films and on the composition of the solution used to form the intermediate film in step II and the PCE (%) of solar cells, including films made using these perovskite films as a light-absorbing layer.

Table 1 and in FIG. 2 presents data on the average size of perovskite grains in MAPbI$_3$ films and on the efficiency of solar cells, including the corresponding perovskite films as a light-absorbing layer, depending on the conditions for their preparation. The following conclusions can be drawn from the data presented:

When MAI is applied to the lead surface without iodine additives in step II, a chemical reaction does not occur, and nucleation of perovskite grains does not occur. The treatment by iodine leads to the formation of a polyiodide melt, which immediately reacts with metallic lead with the formation of a large number of small perovskite grains. As a result, the obtained perovskite films have a relatively small grain size and show relatively low values of efficiency when they are used as a light-absorbing layer in solar cells.

When the composite reagent with the ratio [X$_2$]/[AX]=1 is applied to the lead surface in step II, a MAPbI$_3$ perovskite film with a given grain size is formed immediately, subsequent treatment by halogen does not lead to their reaction growth. As a result, the obtained perovskite films have an average grain size of the order of 500 nm and show relatively low values of efficiency (up to 12%) when used as a light-absorbing layer in solar cells.

When the composite reagent with a molar ratio [X$_2$]/[AX] =0.5 at step II is applied to the surface of the layer of metal (Pb), the "precursor film" containing the seeds (nuclei) of the perovskite-like phase is formed. Then after treatment of said precursor film by iodine, perovskite grains grow due to the chemical reaction. As a result, the obtained perovskite films have a large average grain size (of the order of 700-800 nm) and show high values of efficiency (up to 16%) when used as a light-absorbing layer in solar cells.

Thus, the obtained experimental data directly indicate that the introduction of an intermediate step of perovskite-like compound film processing, ensuring the formation of the precursor film comprising the seeds of the perovskite-like phase, as well as the initial reagents AX and B, is a key step of formation of perovskite films with increased average grain size and provides an increase in the efficiency of resulting perovskite solar cells.

To obtain a perovskite-like compound containing different A$^+$ cations and X$^-$ anions (Table 1) it is important not only the ratio [X$_2$]/[AX], but also the ratio of different cations and anions in the applied composite reagent. In one embodiment, to obtain the film of composition MA$_{0.25}$FA$_{0.75}$PbI$_3$, composite reagent with a [MA$^+$]/[FA$^+$] molar ratio about 3 was used; to obtain the film of composition MA$_{0.25}$FA$_{0.75}$PbBr$_{0.5}$I$_{2.5}$ the molar ratio of [MA$^+$]/[FA$^+$] about 3 and molar ratio [I$^-$]/[Br$^-$] about 5 were used, i.e. the ratio of different A$^+$ cations and the ratio of different X$^-$ anions in the composite reagent should be chosen close to their desired ratio in the resulting film of the organic-inorganic metal-halide compound with perovskite-like structure.

What is claimed is:

1. A method for a preparation of a semiconducting film of an organic-inorganic metal-halide compound with a perovskite-like structure, comprising the following steps:
    a) applying a layer of a precursor of a component B on a substrate,
    b) applying a layer of a composite reagent onto a surface of the precursor layer of the component B, and
    c) treatment of the applied layers on the substrate by a reagent X2 during a time which is necessary and sufficient for completion of a chemical reaction of the applied reagent and the precursor of the component B resulting in organic-inorganic metal-halide perovskite-like compound formation,
    characterizing in that the composite reagent applied in the step b) contains a mixture of AX and X2 reagents with a [X2]/[AX] molar ratio in a range of 0<[X2]/[AX]<1, and the film obtained after the step b) contains the seeds of to a phase with the perovskite-like structure,
    wherein
    the component B contains cations Mn+ of different metals, including Pb, Sn, Bi, selected from Pb, Sn, Bi, as well as mixtures thereof,
    the reagent AX is a salt comprising cation A+ and anion X–, wherein the cation A+ is a singly charged organic or inorganic cation selected from methylammonium CH3NH3+, formamidinium (NH2)2CH+, guanidinium C(NH2)3+, Cs+, Rb+ and unsubstituted (NH4+) or substituted ammonium cations including monosubstituted or disubstituted or trisubstituted or tetrasubstituted ammonium cations, as well as combination thereof; and the anion X– is a singly charged anion selected from Cl—, Br—, I— or a pseudo-halide anion, as well as combination thereof,
    the reagent X2 is a molecular halogen.

2. The method of claim 1, further comprising a step before treatment by reagent X$_2$ wherein the said film containing seeds of the perovskite-like phase is subjected to heat treatment at a temperature of 30 to 300° C., for 1 to 3600 s.

3. The method of claim 1, wherein after completion of step (c), the resulting film of the organic-inorganic metal-halide compound with the perovskite-like structure is subjected to additional post-treatment, including a heat treatment at a temperature of 30 to 400° C. for 1 to 7200 seconds or exposure to inert gas, dry air, moist air, solvent vapors, or exposure to visible, ultraviolet or infrared light, or treatment by a solution or solvent, or a combination of these types of post-treatment.

4. The method of claim 1, wherein the said film at step b) is formed by repeatedly applying the composite reagent of a mixture of AX and X$_2$ from a solution with an equal or different molar ratio of AX and X$_2$.

5. The method of claim 1, wherein the composite reagent applied in the step (b) is distributed uniformly over the surface of the precursor layer of component B using inkjet printing, screen printing, spin-coating, immersion coating, aerosol spraying, in particular ultrasonic spraying, atomization through a nozzle, electro-spraying, spray-jet printing, wherein the said composite reagent is a solution or melt of components A$^+$ and X$^-$ or reagent AX and reagent X$_2$, as well as a colloid or suspension or emulsion containing these substances in liquid or solid phase with additive of one or more solvents.

6. The method of claim 1, wherein the precursor film of component B at the step (a) is obtained in a form of a metal selected from Pb, Sn, Bi or their alloy or a layered structure containing several layers of metals (Pb, Sn, Bi) located one on top of the other, and also in a form of a film of oxide or lead salt, the precursor of component B is applied by a vacuum deposition or by an electrochemical deposition of component B or by a chemical vapor deposition or by a decomposition of a pre-applied solid phase compound containing the component B.

* * * * *